(12) United States Patent
Nakamura

(10) Patent No.: US 6,329,719 B1
(45) Date of Patent: Dec. 11, 2001

(54) SEMICONDUCTOR DEVICE

(75) Inventor: Makiko Nakamura, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/651,280

(22) Filed: Aug. 30, 2000

Related U.S. Application Data

(62) Division of application No. 09/225,352, filed on Jan. 5, 1999, now Pat. No. 6,166,442.

(30) Foreign Application Priority Data

Jul. 30, 1998 (JP) .................................................. 10-215549

(51) Int. Cl.[7] .................................................. H01L 29/40
(52) U.S. Cl. .................... 257/773; 257/691; 257/736; 257/750; 257/758; 257/767; 257/775; 257/781; 257/784; 257/786; 361/748; 174/261
(58) Field of Search ..................... 257/691, 736, 257/750, 758, 767, 773, 775, 781, 784, 786; 361/748; 174/261

(56) References Cited

U.S. PATENT DOCUMENTS

| | | |
|---|---|---|
| 3,270,399 | 9/1966 | Ohntrup . |
| 5,329,162 | 7/1994 | Nadaoka . |
| 5,498,909 | 3/1996 | Hasunuma et al. . |
| 5,506,450 | 4/1996 | Lee et al. . |
| 5,723,908 | 3/1998 | Fuchida et al. . |
| 5,955,788 | 9/1999 | Iwasa . |

Primary Examiner—Eddie Lee
Assistant Examiner—Matthew E. Warren
(74) Attorney, Agent, or Firm—Jones Volentine, PLLC

(57) ABSTRACT

A semiconductor device is comprised of a first wire that has a plurality of via holes formed in the vicinity of an end thereof and that is connected to a conductor of a different layer through the via holes, and a plurality of slits that are provided parallel to the direction in which the first wire extends and that split the first wire into a plurality of second wires over a predetermined distance from the end thereof. Another semiconductor device is comprised of a first wire, a second wire that is on a layer different from that of the first wire and that extends in a direction at right angles to the first wire, a connection area where a portion in the vicinity of an end of the first wire intersects with a portion in the vicinity of an end of the second wire, a plurality of first slits that are provided parallel to the direction in which the first wire extends and that divide the first wire into a plurality of third wires over only a predetermined distance from an end of the first wire, and a plurality of second slits that are provided parallel to the direction in which the second wire extends and that divide the second wire into a plurality of fourth wires over only a predetermined distance from an end of the second wire, and a plurality of via holes that are formed in the connection area and that connect the plurality of third wires and the plurality of fourth wires.

10 Claims, 6 Drawing Sheets

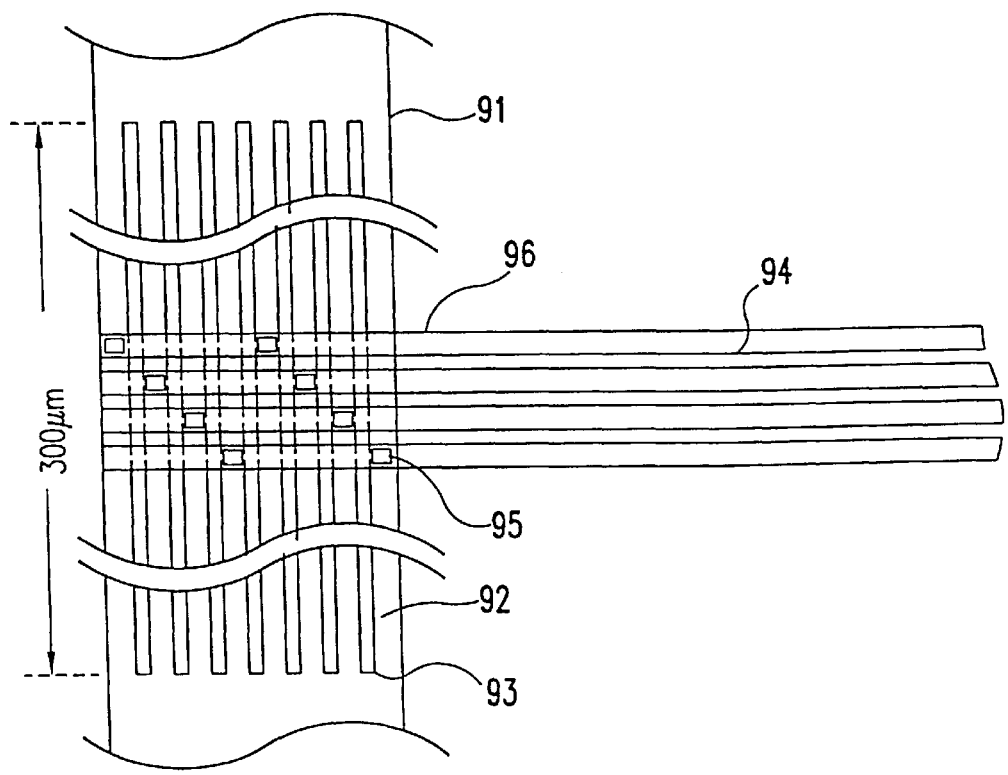
FIG.9
FIG. 10a
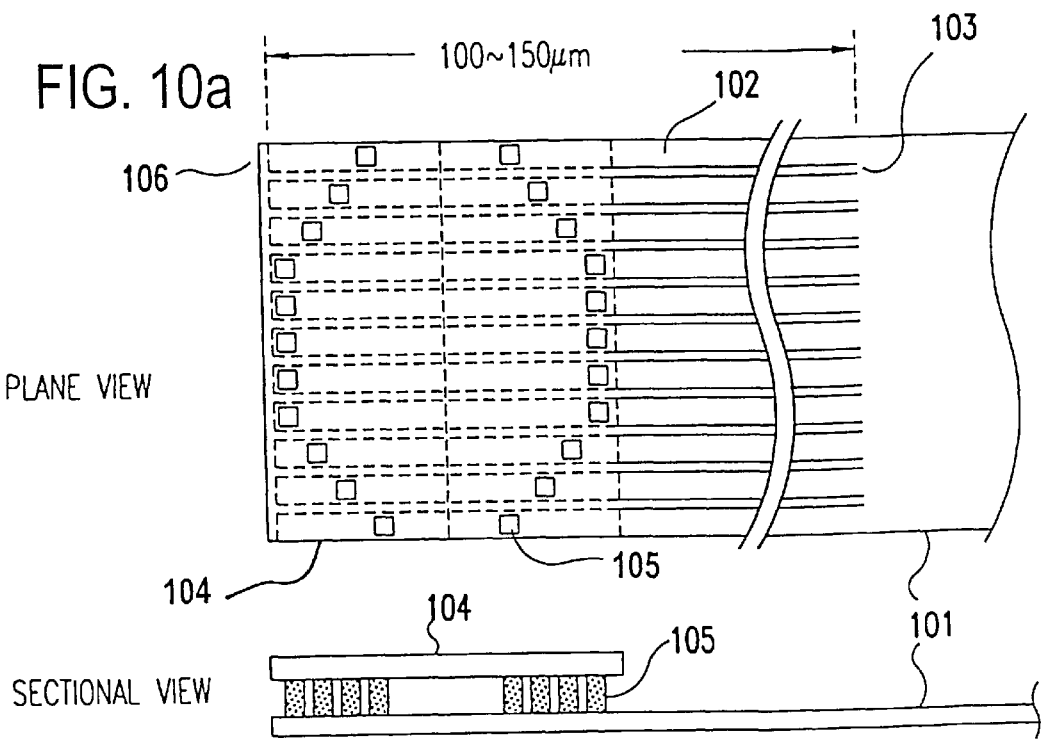
FIG. 10b

SEMICONDUCTOR DEVICE

This application is a divisional of Ser. No. 09/225,352 filed on Jan. 5, 1999 now U.S. Pat. No. 6,166,442.

BACKGROUND OF THE INVENTION

1. Field of the Invention

The present invention relates to a semiconductor device and, more particularly, to improvement of the reliability of wire structures for connecting wires or conductors, which are formed on different layers, by using via holes.

2. Description of Related Art

In general, a metal wire in a semiconductor device is formed by patterning a metal thin film by a photolithography or etching technique. According to the type of each circuit, the thickness of the metal thin film ranges from about 300 nm to about 1000 nm, and the material used therefor is an aluminum alloy, titanium (Ti), titanium nitride (TiN) or other metal having a high melting point. The linewidth is determined by the amount of current flowing through the wire. The amount of current per unit sectional area of wire has been decided for each type of wire material to prevent problems attributable to electromigration, the established amount of current being known as permissible current density. For instance, when more current need to flow through a wire, a wider wire is used. Normally, a wider wire exhibits higher resistance to electromigration than a narrower wire; hence, a wire of a predetermined width or more is capable of retaining reliability even when the amount of current per unit sectional area is increased. For this reason, there is a trend toward increasing the permissible current density of a wide wire.

The recent trend toward multi-layer wiring requires that the reliability of wires be guaranteed in two or more layers electrically connected through via holes. This has led to a difficulty in increasing the permissible current density of the conventionally used wide wires, or it has even made it inevitable to decrease the permissible current density because a larger linewidth means a shorter electromigration life. This has resulted in an inconvenience in that the linewidth has been further increased, interfering with an attempt to make devices with even finer patterns or higher integration.

There has been another inconvenience in that, when electrical connection is made through a via hole between an upper layer wire and a lower layer wire orthogonally formed, concentration of current occurs around the via hole formed on the side of an interior angle of the orthogonal area, and voids due to electromigration tend to be produced in the neighborhood.

SUMMARY OF THE INVENTION

Accordingly, it is an object of the present invention to provide a semiconductor device with high reliability that has an extended electromigration life of the wires electrically connected with conductors of different layers through via holes.

To this end, according to one aspect of the present invention, there is provided a semiconductor device comprised of: a first wire that has a plurality of via holes formed in the vicinity of an end thereof and that is connected with a conductor of a different layer through the via holes; and a plurality of slits that are provided parallel to a direction in which the first wire extends and that split the first wire into a plurality of second wires over only a predetermined distance from the end.

According to another aspect of the present invention, there is provided a semiconductor device comprised of: a first wire; a second wire of a layer different from that of the first wire, the second wire extending in a direction at right angles to the first wire; a connection area where a portion in the vicinity of an end of the first wire intersects with a portion in the vicinity of an end of the second wire; a plurality of first slits that are provided parallel to the direction in which the first wire extends and that divide the first wire into a plurality of third wires over only a predetermined distance from the end thereof; a plurality of second slits that are provided parallel to the direction in which the second wire extends and that divide the second wire into a plurality of fourth wires over only a predetermined distance from the end thereof; and a plurality of via holes that are formed in the connection area and that connect the plurality of third wires and the plurality of fourth wires.

BRIEF DESCRIPTION OF THE DRAWINGS

While the specification concludes with claims particularly pointing out and distinctly claiming the subject matter which is regarded as the invention, it is believed that the invention, the objects, features of the invention and further objects, features and advantages thereof will be better understood from the following description taken in connection with the accompanying drawings in which:

FIG. 9 is a schematic representation showing another example of the third embodiment of the present invention; and FIGS. 10a and 10b are schematic representations showing a fourth embodiment of the present invention.

DESCRIPTION OF THE PREFERRED EMBODIMENTS

First Embodiment

Figure 1:
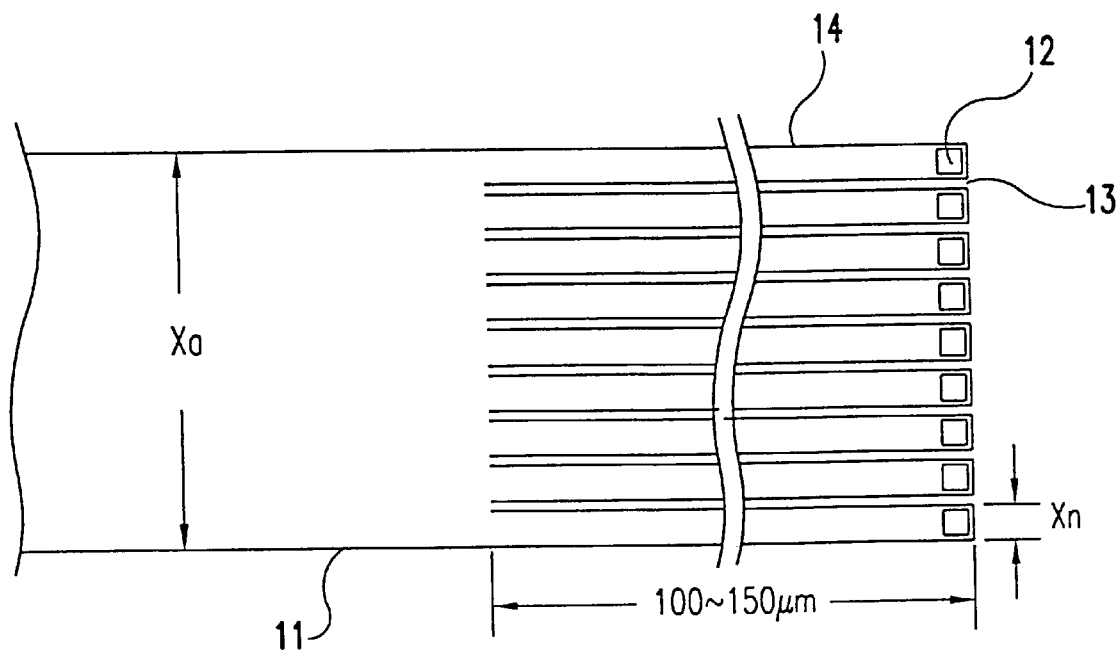
FIG. 1 is a schematic representation illustrating a first embodiment of the present invention.

FIG. 1 is a schematic diagram showing a first embodiment of the present invention.

An aluminum wire (hereinafter referred to as "metal wire") 11 is electrically connected to a conductor (not shown) formed on a layer different from that of the metal wire 11 through a plurality of via holes 12 formed in the vicinity of an end thereof. The conductor in this case may be a metal wire, an electrode pad, or the like. The metal wire 11, which has a width Xa of 5 $\mu$m or more, is split into a plurality of metal wires 14 by a plurality of slits 13 over a distance of about 100 $\mu$m to about 150 $\mu$m from the end thereof. A width Xn of each of the metal wires 14 is approximately 2 $\mu$m or less.

The total width of the plurality of metal wires 14 and the plurality of slits 13 is equal to the width Xa of the metal wire 11. Preferably, the width of each of the slits 13 is controlled to a minimum value that allows films to be formed without causing an upper layer cap film such as an interlayer film or passivation film to produce voids between the metal wires 14 in a later process. In this case, adjoining metal wires 14 share the same node; hence, no particular problem should arise even if a short circuit takes place between the wires. After such a wiring pattern is formed, an oxide film is deposited to a thickness of approximately 1000 Å by the plasma CVD to fully fill the slits 13. Then, SOG is applied to bury the slits 13, and a passivation film of SiN is further formed thereover.

Figure 2:
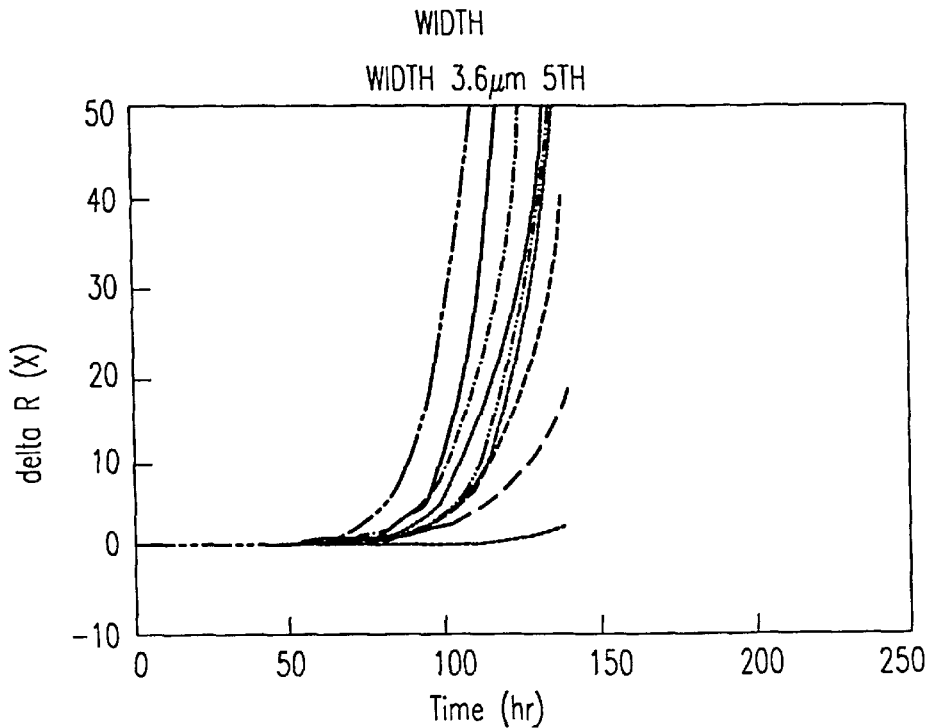
FIG. 2 shows a graph illustrating an electromigration test result.
Figure 3:
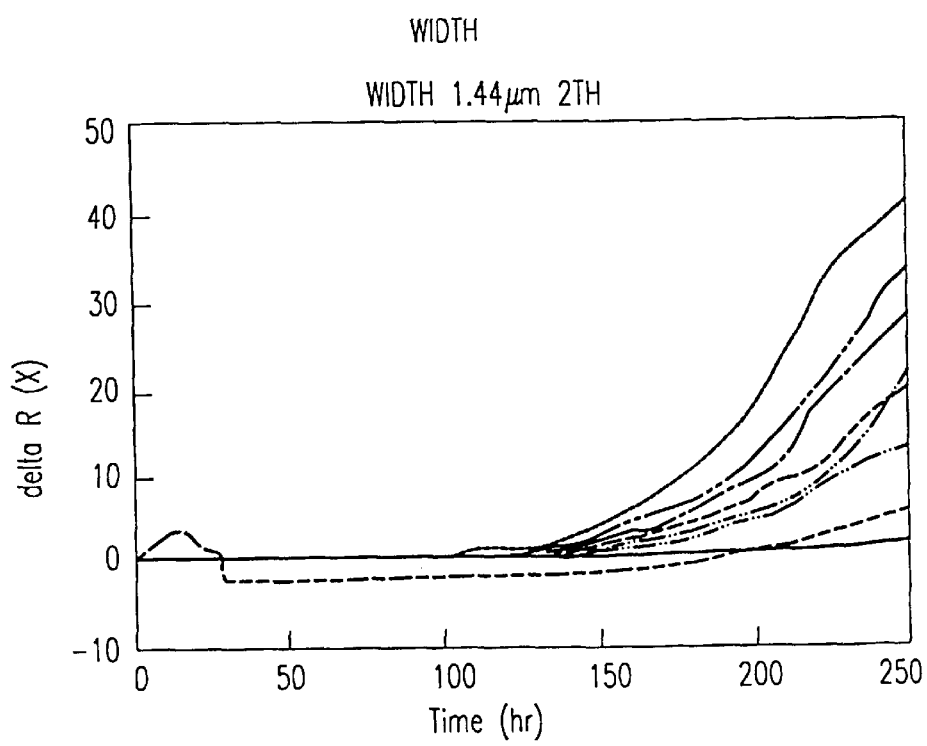
FIG. 3 shows another graph illustrating an electromigration test result.

FIG. 2 shows a graph illustrating the result of an electromigration test conducted with a metal wire having a width of 3.6 $\mu$m and five via holes. FIG. 3 shows a graph illustrating the result of the electromigration test conducted with a metal wire having a width of 1.44 $\mu$m and two via holes. Reference character "STH" in FIG. 2 denotes "five through holes or via holes," and "2TH" in FIG. 3 denotes "two through holes or via holes."

In the electromigration test, the results of which are shown in FIG. 2 and FIG. 3, the value of flowing current per unit area of the wire and the value of flowing current per via hole are identical. In both graphs, the increasing rate of resistance is indicated on the axis of ordinate and the lapse of time is indicated on the axis of abscissa to show the increase in resistance in each metal wire.

According to the two graphs, it is seen that the wider metal wire having the 3.6 $\mu$m width shown in FIG. 2 takes less time to start the increase in resistance than the narrower metal wire having the 1.44 $\mu$m width shown in FIG. 3 does, and it also exhibits a steeper gradient after the increase in resistance begins, indicating a rapid increase in resistance. This means that the wider metal wire having the 3.6 $\mu$m width is more susceptible to electromigration with a consequent shorter service life. For this reason, it is desirable to set the width of each of the metal wires 14 to about 2 $\mu$m or less.

Figure 4:
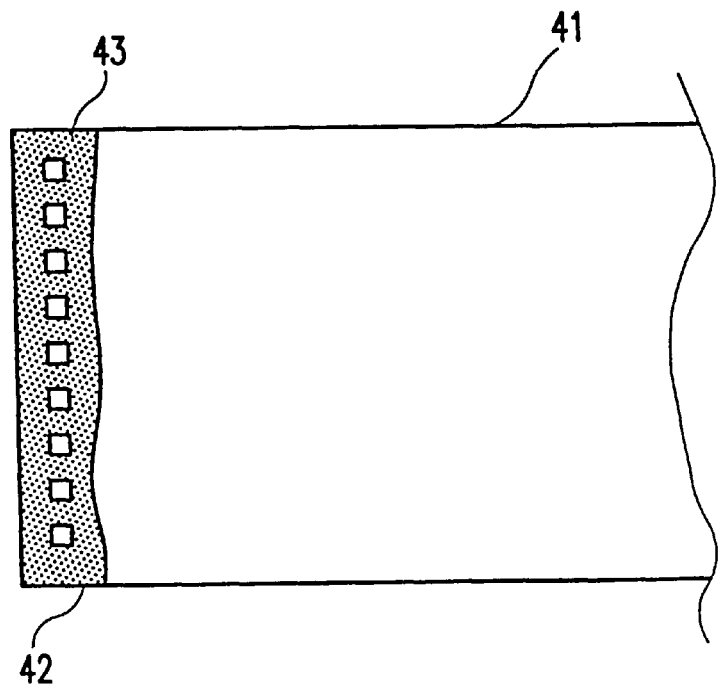
FIG. 4 is a schematic representation showing the condition of a wide wire after the wire has been subjected to the electromigration test.
Figure 5:
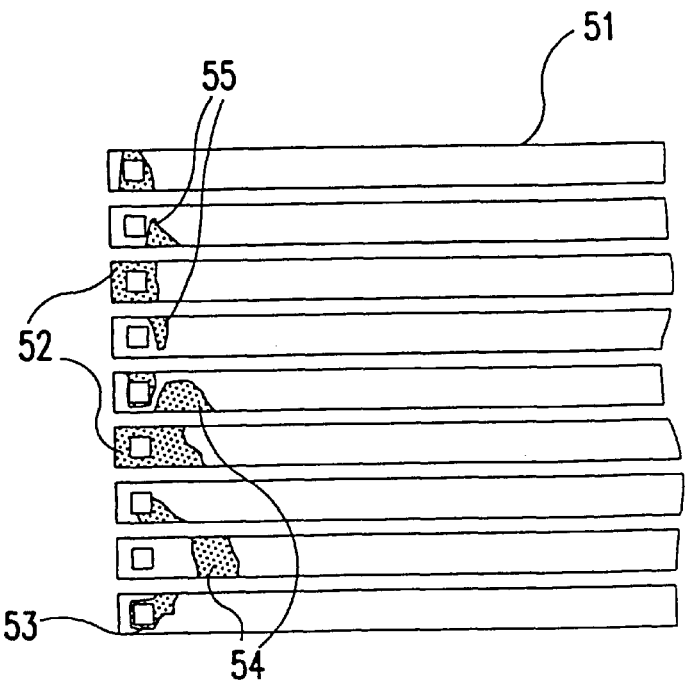
FIG. 5 is a schematic representation showing the condition of a narrow wire after the wire has been subjected to the electromigration test.

FIG. 4 is a schematic representation showing the condition of a wide wire after the wire has been subjected to the electromigration test. FIG. 5 is a schematic representation showing the condition of a narrow wire after the wire has been subjected to the electromigration test, the width of the narrow wire being 2 $\mu$m or less.

In a wide wire 41 shown in FIG. 4, it is seen that a void 42 indicated as a black portion has occurred evenly from the end of the wire. If the void 42 reaches a via hole 43, a fault attributable to electromigration results. In the case of a narrow wire 51 shown in FIG. 5, it is seen that each narrow wire 51 has a different way of how voids are formed. This is shown by voids 52 formed on the end of the wire, voids 54 formed away from the end of the wire and via holes 53, and small wedge-shaped voids 55. In other words, not all the split wires of the narrow wire 51 fail at the same time, thus permitting higher reliability.

Although it is not shown, the observation of the cross section of an aluminum wire that has been subjected to the foregoing electromigration test, i.e. after it has incurred a failure, reveals that voids grow from the end of the wire on the cathode side where via holes are formed. It has also been observed that aluminum atoms that have moved due to the electromigration accumulate at a location of about 50 $\mu$m to about 100 $\mu$m on the anode side from the connection made by the via holes, resulting in a bulging wire surface. It may be said, therefore, that the influences of the electromigration on the aluminum wire are dominant in the area of about 50 $\mu$m to about 100 $\mu$m from the connection made by the via holes.

Thus, according to the first embodiment of the present invention, a wide wire having via holes formed in the vicinity of an end thereof is provided with the slits formed over only the predetermined distance from the end thereof, where electromigration is dominant. This permits a prolonged electromigration life of the wire and also allows more current to flow therethrough with the same linewidth. In this case, the predetermined distance from the end of the wire, over which the slits are provided, is preferably about 100 $\mu$m or more according to the test results.

Considering the widths of the slits 13, the total width, namely, n x Xn, of the metal wires 14 resulting from splitting will be smaller than the width Xa of the metal wire 11 before splitting it. However, the amount of current limited by the smaller total width can be more than sufficiently made up for by the increased amount of current that can be flown due to the prolonged electromigration life accomplished as an advantage presented by the present invention.

Second Embodiment

Figure 6:
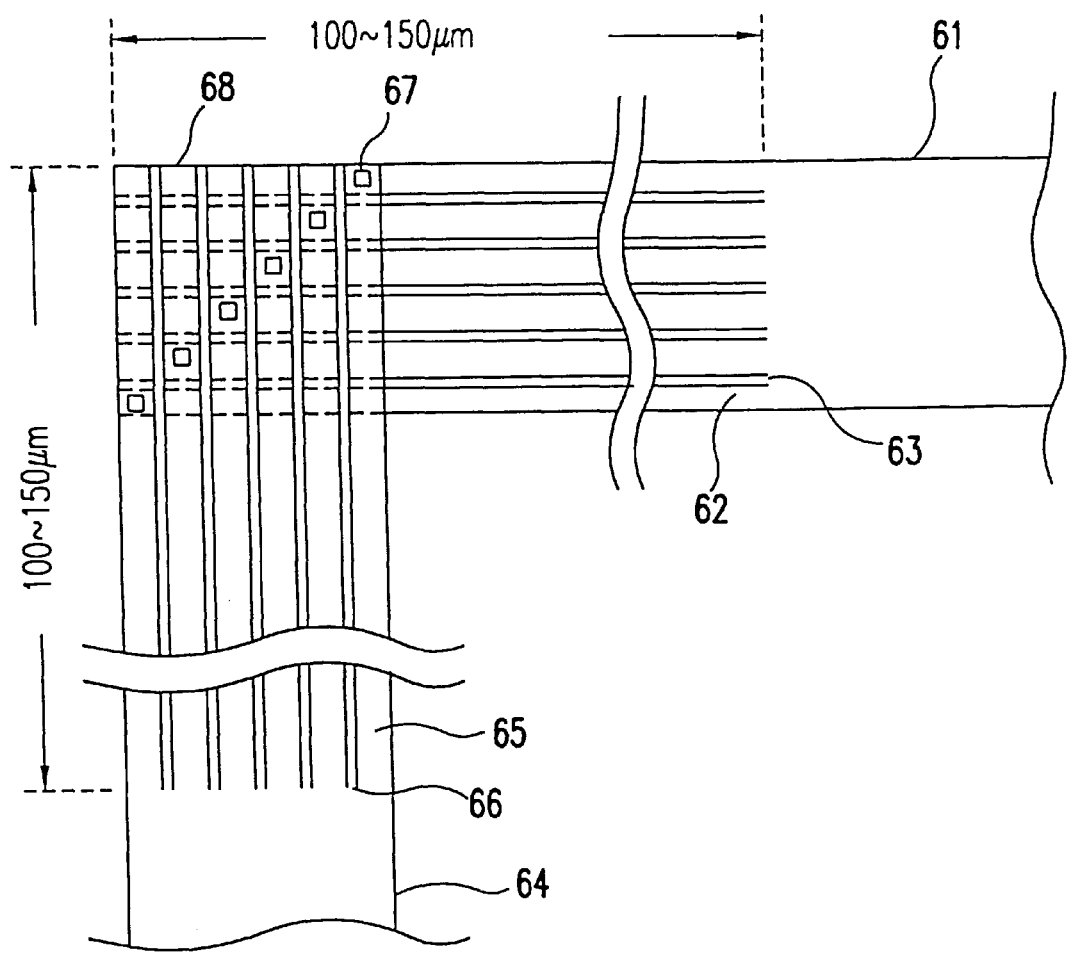
FIG. 6 is a schematic representation showing a second embodiment of the present invention.
Figure 7:
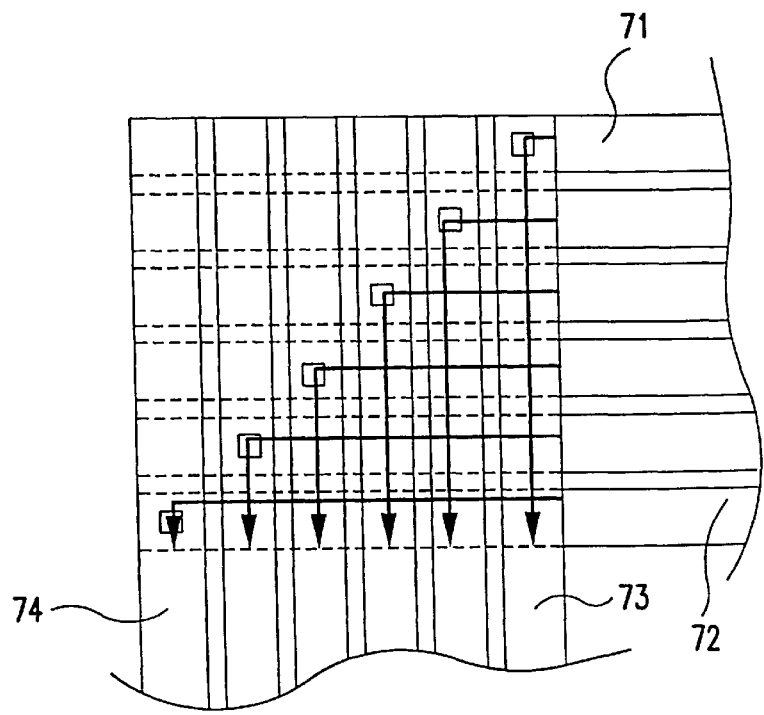
FIG. 7 is an enlarged view of an essential section of FIG. 6.

FIG. 6 is a schematic representation showing a second embodiment of the present invention; and FIG. 7 is an enlarged view of an essential section.

A metal wire 61 and a metal wire 64 located on a layer over the metal wire 61 are electrically connected through a plurality of via holes 67 formed in a connection area 68 where the portions in the vicinity of the ends of these two metal wires intersect with each other. The metal wire 61 is split into a plurality of metal wires 62 by a plurality of slits 63 over a range of about 100 $\mu$m to about 150 $\mu$m from the end thereof. In this case, the width of each of the metal wires 62 is approximately 2 $\mu$m or less. Likewise, the metal wire 64 is split into a plurality of metal wires 65 by a plurality of slits 66 over a range of about 100 $\mu$m to about 150 $\mu$m from the end thereof. In this case, the width of each of the metal wires 65 is approximately 2 $\mu$m or less.

At least one via hole 67 is formed in the metal wires 62 and 65, respectively, and disposed so that the current path lengths thereof in the connection area 68 are substantially the same. FIG. 7 is an enlarged view of the connection are 68, the respective current paths being indicated by thick solid lines with arrowheads. In this embodiment, the current path lengths are made substantially identical by connecting, for example, an outermost wire 71 of the lower layer to an innermost wire 73 of the upper layer, and by connecting an innermost wire 72 of the lower layer to an outermost wire 74 of the upper layer. This allows even current to flow through the wires, thus making it possible to obviate the inconvenience of the influences of electromigration caused by the concentration of current in the vicinity of the via holes formed on the interior angle side.

In general, there is limitation on the amount of current flowing through one via hole; hence, it is required to set an appropriate number of via holes according to the amount of current flowing through the wires. In this embodiment, the example wherein the plurality of via holes 67 are formed on the diagonal line of the connection area 68 as shown in FIG. 6 has been described; it is also possible, however, to form more via holes along the diagonal line as necessary.

Third Embodiment

Figure 8:
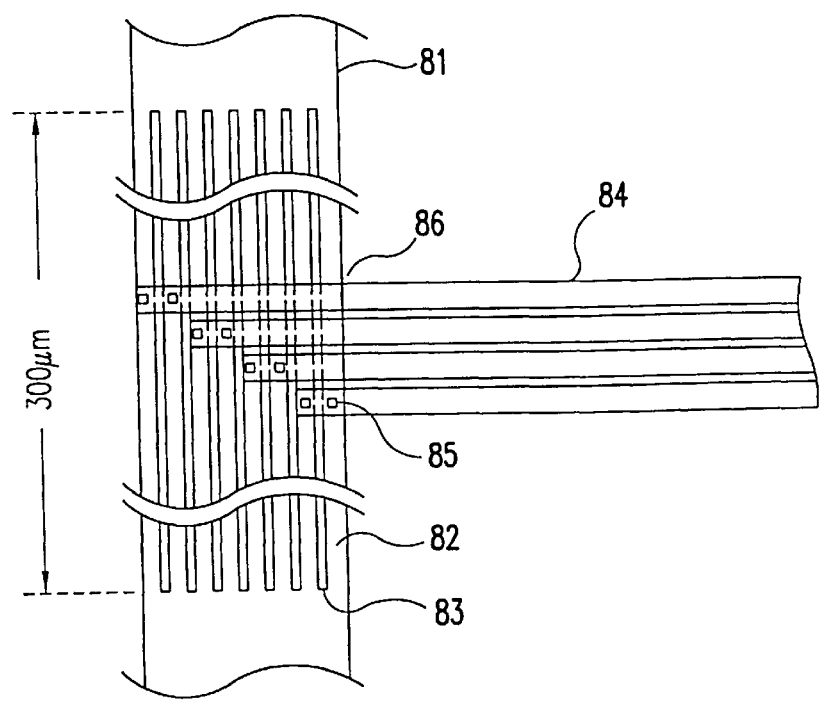
FIG. 8 is a schematic representation showing a third embodiment of the present invention.

FIG. 8 is a schematic representation showing a third embodiment in accordance with the present invention; and FIG. 9 is a schematic representation showing another example of the third embodiment in accordance with the present invention.

In FIG. 8, a wide metal wire 81 is electrically connected to a plurality of narrow metal wires 84 on an upper layer over the metal wire 81 through a plurality of via holes 85. The wide metal wire 81 is split into a plurality of metal wires 82 by a plurality of slits 83 over a range of approximately 300 μm with a connection area 86 at the center thereof. In the connection area 86, the metal wire 81 and the plurality of metal wires 84 intersect with each other, and a plurality of via holes 85 are formed. The width of each of the metal wires 82 is approximately 2 μm or less.

The number of the plurality of slits 83 and the number of locations of the plurality of via holes 85 are decided according to the number of the narrow metal wires 84. In other words, these numbers are decided to ensure even flow of current through the metal wires 82. In this embodiment, the plurality of via holes 85 in the connection area 86 are disposed to connect the outermost wire of a lower layer to the innermost wire of an upper layer, or to connect the innermost wire of a lower layer to the outermost wire of an upper layer with respect to the current paths. As a result, the current path lengths in the wires are substantially the same. Thus, even current flows through the metal wires 82, obviating the inconvenience of the influences of electromigration caused by the concentration of current in the vicinity of the via holes formed on the interior angle side.

FIG. 9 shows another example of the third embodiment. A wide metal wire 91 is electrically connected to a plurality of narrow metal wires 94 on an upper layer over the metal wire 91 through a plurality of via holes 95. The wide metal wire 91 is split into a plurality of metal wires 92 by a plurality of slits 93 over a range of approximately 300 μm with a connection area 96 at the center thereof. In the connection area 96, the metal wire 91 and the plurality of metal wires 94 intersect with each other, and a plurality of via holes 95 are formed. The width of each of the metal wires 92 is approximately 2 μm or less.

In FIG. 9, the electrical connection in the wires is made, assuming that the connection area 96 has been divided into two sections at the dashed line or the centerline shown in the drawing. To be more specific, The via holes 95 on one section of the divided connection area 96 are disposed to connect the outermost wire of a lower layer to the innermost wire of an upper layer and to connect the innermost wire of the lower layer to the outermost wire of the upper layer with respect to the current paths. The same applies to the other section of the divided connection area 96. As a result, the current path lengths in all the wires are substantially the same, enabling even current to flow through the split metal wires 92. Hence, the same advantage as that obtained by the example illustrated in FIG. 8 can be expected also in this example.

Fourth Embodiment

FIGS. 10a and 10b are schematic diagrams showing a fourth embodiment in accordance with the present invention; FIG. 10A gives a plan view and FIG. 10B a sectional view thereof.

A metal wire 101 is electrically connected to a bonding pad 104 through a plurality of via holes 105 formed in the vicinity of an end thereof. The metal wire 101 is split into a plurality of metal wires 102 from the end thereof by a plurality of slits 103. The range where the metal wire 101 is split is made longer than a connection area 106 where the metal wire 101 intersects with the bonding pad 104. In this embodiment, the metal wires 101 is split over a range of about 100 μm to about 150 μm. The width of each of the metal wires 102 is preferably about 2 μm or less; however, it should be appropriately set according to the width of a metal wire of other layer or the size of the via holes 105.

Normally, the plurality of via holes formed in the bonding pad are disposed along the peripheral area of the bonding pad to improve the reliability of wire bonding. This disposition, however, has been posing a problem in that greater concentration of current takes place in the vicinity of the via holes disposed parallel to the direction in which the metal wires to be connected extend and that a fault occurs due to the voids growing from the ends of the metal wires.

To solve the problem mentioned above, in this embodiment, the metal wires 102 and the bonding pad 104 are electrically connected, assuming that the connection area 106 has been divided into two sections at the dashed line or the centerline shown in the drawing. To be more specific, a plurality of via holes 105 in one section of the divided connection area 106 are arranged in an arc pattern so that those at the bottom are located near an end of the metal wire 101. The plurality of via holes 105 in the other section of the divided connection area 106 are arranged so that they are axially symmetric with respect to the dashed line. This enables the amount of current flowing through the wires 102 to be substantially the same and it also minimizes the chance of voids growing from the end of the metal wire 101. Thus, a semiconductor device with higher reliability can be provided.

As set forth in detail above, according to the semiconductor device in accordance with the present invention, a wide metal wire electrically connected to a conductor of a different layer through via holes is provided with slits formed over only a predetermined distance from an end thereof, where electromigration is dominant. This prolongs the electromigration life of the wire and allows more current to flow through the wide metal wire without increasing its linewidth.

What is claimed is:

1. A semiconductor device comprising:
   a first elongate wire extending in a first layer and having a first and a second remaining portions and a connecting portion, wherein said connecting portion of said first elongate wire has a plurality of parallel slits formed therein which extend lengthwise between said first remaining portion to define a plurality of parallel divided wire portions;
   a second elongate wire extending at right angles to first elongate wire in a second layer which is different than said first layer, said second elongate wire having an end portion and a remaining portion, wherein said end portion of said second elongate wire overlaps said connecting portion of said first elongate wire, and said end portion of said second elongate wire has a plurality of parallel slits formed therein which extend lengthwise from said remaining portion to a distal end of said end portion to define a plurality of parallel elongate wire end portions; and
   a plurality of via holes contacting said plurality of parallel divided wire portions and said plurality of parallel elongate wire end portions, wherein said plurality of parallel divided wire portions are connected to said plurality of parallel elongate wire portions through said via holes.

2. A semiconductor device according to claim 1, wherein each of said plurality of parallel divided wire portions and said plurality of parallel elongate wire end portions has at least one via hole contacted therewith.

3. A semiconductor device according to claim 1, wherein a length of each of said end portions of said second elongate wire is 100 μm or more.

4. A semiconductor device according to claim 1, wherein a width of each of said remaining portions of said first and second elongate wires is 5 μm or more, and wherein a width of each of said plurality parallel elongate wire end portions is 2 μm or less.

5. A semiconductor device according to claim 1, wherein a width of each of said plurality of parallel slits of each of said first and second elongate wires is a minimum width that allows an upper layer cap film to be formed later.

6. A semiconductor device comprising:

a first elongate wire extending in a first layer and having a first and a second remaining portions and a connecting portion, wherein said connecting portion of said first elongate wire has a plurality of parallel slits formed therein which extend lengthwise between said first remaining portion to said second remaining portion to define a plurality of parallel divided wire portions;

a second elongate wire extending at right angles to first elongate wire in a second layer which is different than said first layer, said second elongate wire having an end portion and a remaining portion, wherein said end portion of said second elongate wire overlaps said connecting portion of said first elongate wire, and said end portion of said second elongate wire has a plurality of parallel slits formed therein which extend lengthwise from said remaining portion to a distal end of said end portion to define a plurality of parallel elongate wire end portions; and a plurality of via holes contacting said plurality of parallel divided wire portions and said plurality of parallel elongate wire end portions, wherein said plurality of parallel divided wire portions are connected to said plurality of parallel elongate wire end portions through said via holes, and wherein said plurality of via holes are positioned such that a current path from one of said remaining portion of said first elongate wire to said remaining portion of said second elongate wire is substantially the same through each of said connecting portion and said parallel elongate wire end portions.

7. A semiconductor device according to claim 6, wherein each of said plurality of parallel divided wire portions and said plurality of parallel elongate wire end portions has at least one via hole contacted therewith.

8. A semiconductor device according to claim 6, wherein a length of each of said end portions of said second elongate wire is 100 μm or more.

9. A semiconductor device according to claim 6, wherein a width of each of said remaining portions of said first and second elongate wires is 5 μm or more, and wherein a width of each of said said plurality parallel elongate wire end portions is 2 μm or less.

10. A semiconductor device according to claim 6, wherein a width of each of said plurality of parallel slits of each of said first and second elongate wires is a minimum width that allows an upper layer cap film to be formed later.

* * * * *